US008057161B2

(12) United States Patent
Seidler

(10) Patent No.: US 8,057,161 B2
(45) Date of Patent: Nov. 15, 2011

(54) FAN WITH INTEGRATED NONRETURN FLAPS

(75) Inventor: Siegfried Seidler, Villingen-Schwenningen (DE)

(73) Assignee: EBM-PAPST St. Georgen GmbH & Co. KG, St. Georgen (DE)

( * ) Notice: Subject to any disclaimer, the term of this patent is extended or adjusted under 35 U.S.C. 154(b) by 1024 days.

(21) Appl. No.: 11/679,946

(22) Filed: Feb. 28, 2007

(65) Prior Publication Data

US 2008/0056900 A1 Mar. 6, 2008

(30) Foreign Application Priority Data

Sep. 5, 2006 (DE) ............... 20 2006 013 982 U

(51) Int. Cl.
*F04D 29/52* (2006.01)

(52) U.S. Cl. .............. 415/26; 415/146; 415/211.2

(58) Field of Classification Search ............ 415/26, 415/36, 39, 41, 47, 49, 126, 146, 211.2, 220; 361/679.48, 979.51, 695
See application file for complete search history.

(56) References Cited

U.S. PATENT DOCUMENTS

| 3,263,906 | A | * | 8/1966 | Ward ............................ 415/146 |
| 3,334,569 | A | | 8/1967 | Lambie ........................... 98/116 |
| 6,011,689 | A | * | 1/2000 | Wrycraft ........................ 361/695 |
| 6,017,191 | A | | 1/2000 | Harmsen ................... 416/247 R |
| 6,031,717 | A | | 2/2000 | Baddour et al. .............. 361/687 |
| 6,115,250 | A | * | 9/2000 | Schmitt ......................... 361/695 |
| 6,174,232 | B1 | | 1/2001 | Stoll et al. ..................... 454/184 |
| 6,398,492 | B1 | | 6/2002 | Cho et al. ...................... 415/191 |
| 6,561,762 | B1 | | 5/2003 | Hong et al. .................. 415/211.2 |
| 6,663,342 | B2 | | 12/2003 | Huang et al. ................ 415/121.2 |
| 6,705,833 | B2 | | 3/2004 | Tam et al. ...................... 415/146 |
| 6,939,105 | B2 | | 9/2005 | Horng et al. .................. 415/191 |
| 7,014,420 | B2 | | 3/2006 | Chang et al. ............... 415/121.2 |
| 7,025,086 | B2 | | 4/2006 | Maeda et al. ............... 137/512.1 |
| D603,951 | S | * | 11/2009 | Seidler ........................ D23/370 |
| 2003/0026691 | A1 | | 2/2003 | Huang et al. ............... 415/121.2 |
| 2003/0091435 | A1 | | 5/2003 | Horng et al. ............... 415/211.2 |
| 2006/0039784 | A1 | * | 2/2006 | Yan et al. ....................... 415/220 |
| 2011/0116909 | A1 | * | 5/2011 | Weisser et al. ................. 415/126 |

FOREIGN PATENT DOCUMENTS

EP 1 016 790 B 5/2000

* cited by examiner

*Primary Examiner* — Nathaniel Wiehe
(74) *Attorney, Agent, or Firm* — Milton Oliver, Esq.; Oliver Intellectual Property LLC

(57) ABSTRACT

A fan structure, suitable for rack-mounting adjacent to heat-generating electrical equipment, features an improved noise-damping outflow baffle containing a plurality of non-return flaps, serving to prevent reverse flow of air when fan activity is interrupted. In a preferred embodiment, four generally sickle-shaped flaps are used, each connected, along a straight edge thereof, by a pair of elastomeric hinge connections to a surrounding frame. The hinge connections urge the flaps closed whenever they are not forced by airflow into an open orientation. The axes of rotation of the flaps are chosen to keep them from jamming against one another. Since the flaps act as vanes, tending to straighten out an originally helical flow of air induced by the fan, they minimize the pressure drop which has therefore been associated with outflow baffles. The use or elastomers at critical points in the structure reduce noise and clatter.

14 Claims, 16 Drawing Sheets

FAN WITH INTEGRATED NONRETURN FLAPS

CROSS-REFERENCE

This application claims priority from German Utility Model application DE 20 2006 013 982.6, filed 5 Sep. 2006, the entire content of which is hereby incorporated by reference.

FIELD OF THE INVENTION

The invention related to a fan such as an axial or diagonal fan.

BACKGROUND

To cool electronic devices, frequently several fans are operated in parallel in a plug-in unit or the like, for example in a so-called "rack" for servers or in the switch cabinet of a ground station for cell phones. The use of the plurality of fans serves to provide a degree of redundancy, i.e. of one of the fans fails, then the remaining fan or fans assure(s) a continued sufficient supply of cooling air.

If one of the fans in a plug-in unit fails, while the other fans continue to run, then a reverse flow of air would circulate through the stopped fan, which makes it necessary to take steps minimize this reverse flow. To this end, check valve flaps, also called non-return or anti-blowback flaps, are used, which automatically close when the air flows in the wrong direction. An example of this is disclosed in U.S. Pat. No. 6,174,232, STOLL+/IBM, which also describes the problem that the check valves used represent an additional flow resistance, and thus reduce the performance of the fan.

SUMMARY OF THE INVENTION

It is therefore an object of the present invention to provide a new fan structure which overcomes, or at least minimizes, such disadvantages.

According to the invention, this object is achieved by using an outflow baffle which is configured to at least partially straighten out the originally helical flow of existing air, thereby converting this helical motion into static pressure. By using this outflow baffle or guide element, one version of which is known in principle from U.S. Pat. No. 6,017,191, HARMSEN, a part of the pressure loss that is caused by the at least one non-return or check valve flap is compensated for, by the fact that the outflow baffle generates an additional static pressure. In addition, the outflow baffle reduces the helical motion of the air flowing out of the outflow baffle. This helical motion might cause the flap(s) to clatter or flutter; the outflow baffle reduces this effect, so that a plug-in fan unit with improved fans of this kind operates more quietly, because the flow strikes the flaps with a reduced amount of helical motion, which also improves efficiency.

BRIEF FIGURE DESCRIPTION

Other details and advantageous modifications of the invention can be understood from the exemplary embodiments, which are described below and shown in the drawings. These examples are not intended to limit the invention in any way.

DETAILED DESCRIPTION

Figure 11:
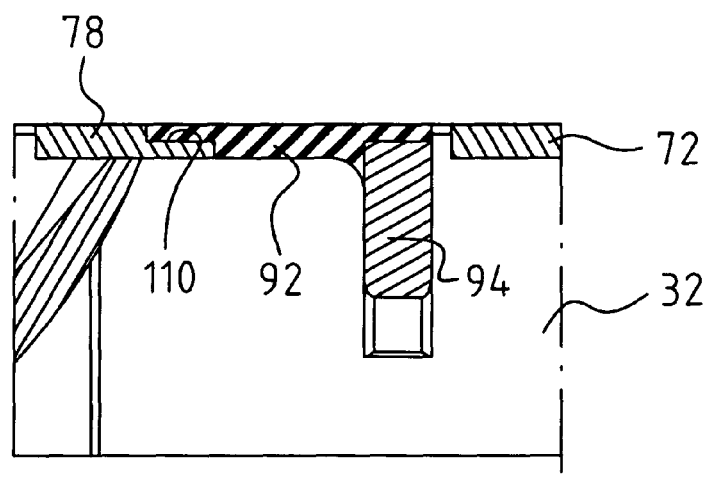
FIG. 11 is a section through a hinge element of a closed non-return flap, viewed along the line XI-XI of FIG. 10.
Figure 12:
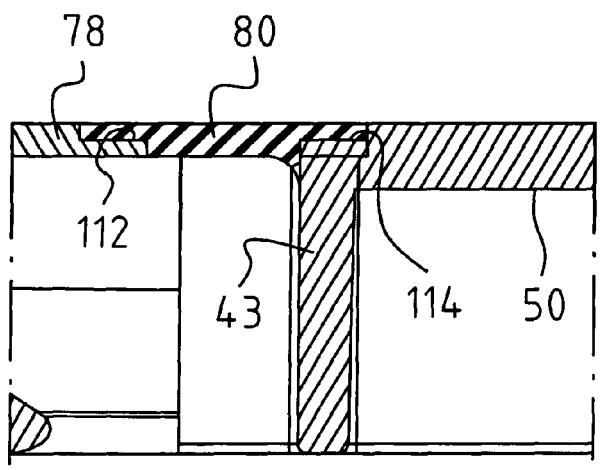
FIG. 12 is a section, viewed along the line XII-XII of FIG. 10.
Figure 13:
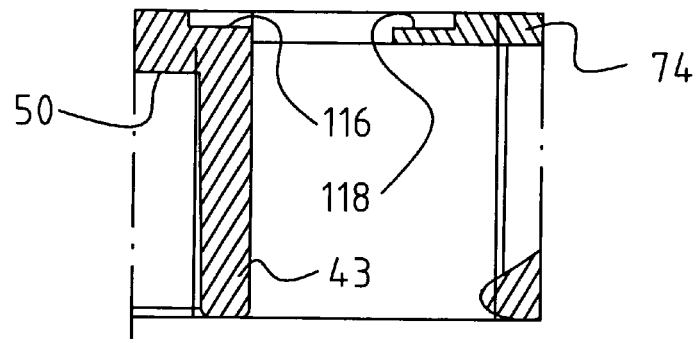
FIG. 13 is a section, viewed along the line XIII-XIII of FIG. 10.
Figure 14:
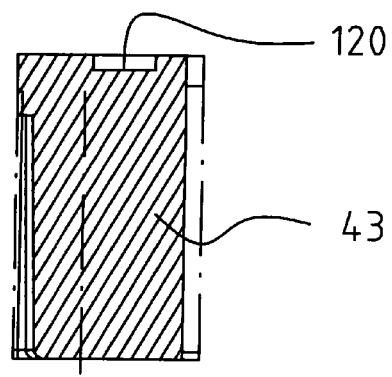
FIG. 14 is a section, viewed along the line XIV-XIV of FIG. 10.
Figure 16:
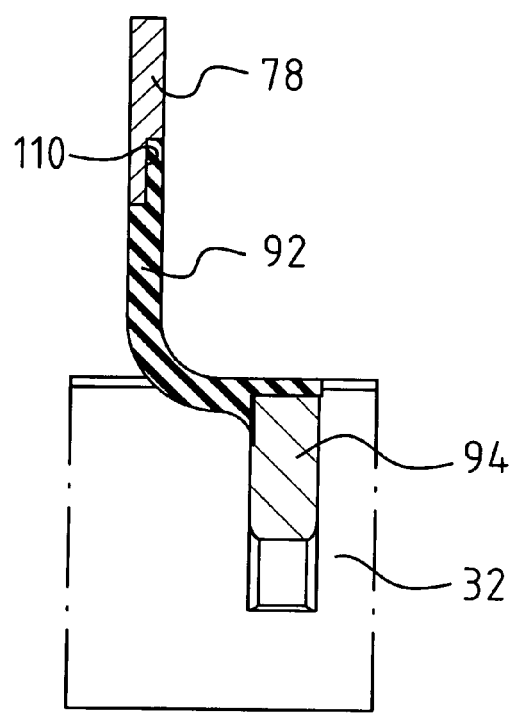
FIG. 16 is a section through a hinge element of an open flap, viewed along the line XVI-XVI of FIG. 15.
Figure 17:
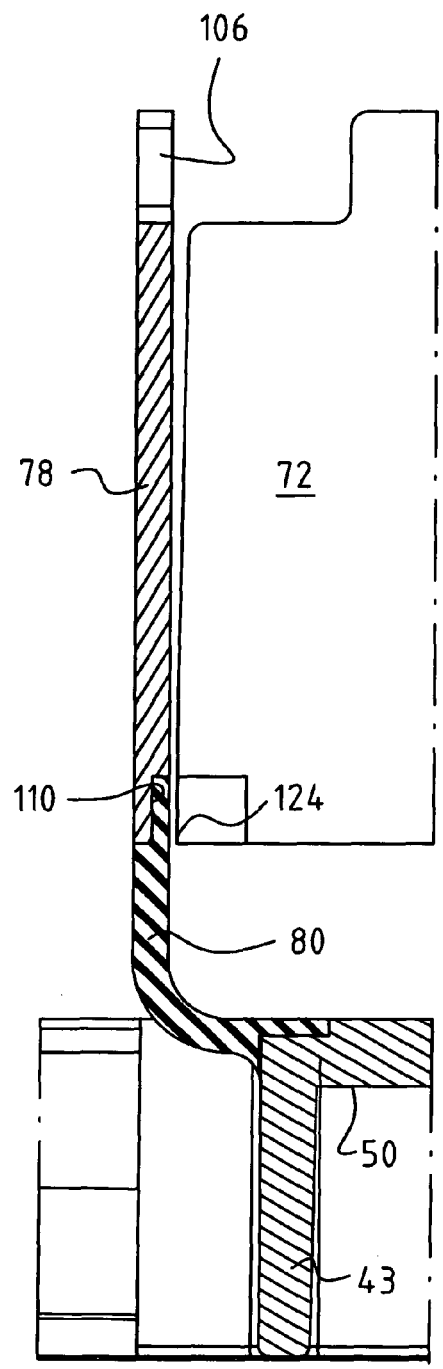
FIG. 17 is a section, viewed along the line XVII-XVII of FIG. 15.
Figure 18:
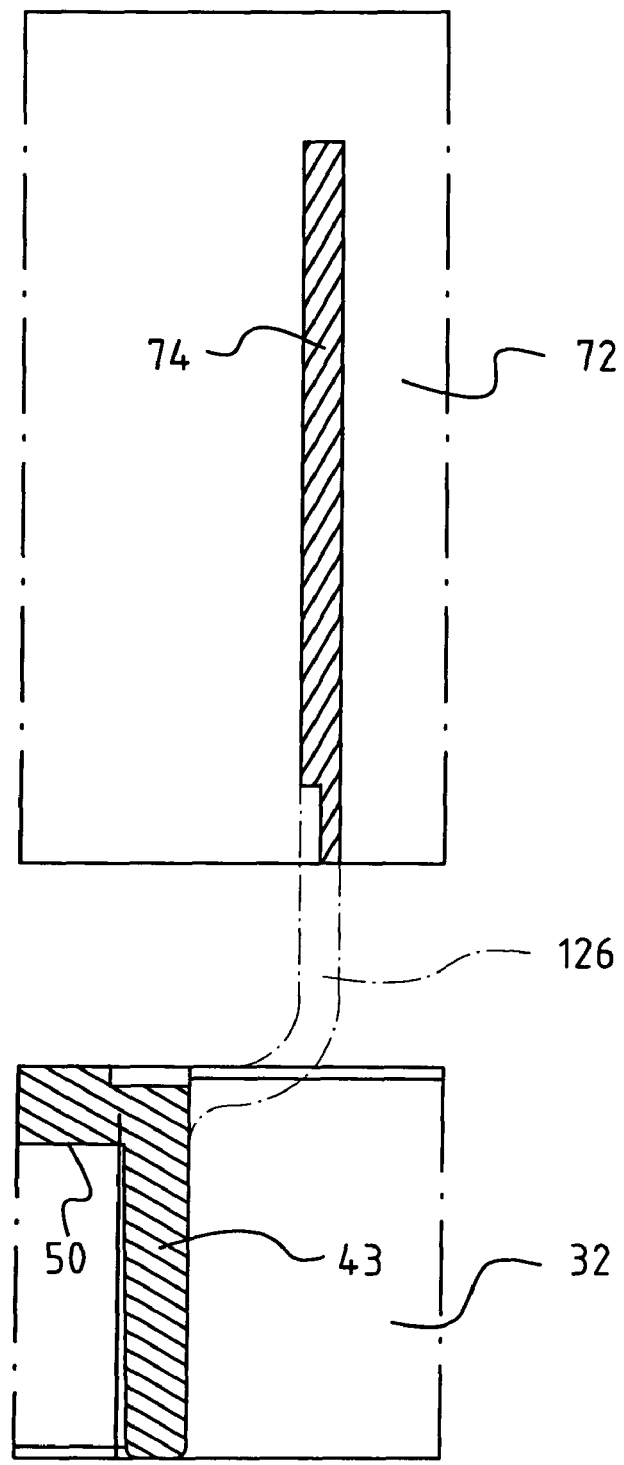
FIG. 18 is a section, viewed along the line XVIII-XVIII of FIG. 15.

It should be noted that the hinges of the valve flaps in the preferred exemplary embodiment are preferably implemented as elastic bands and that these bands are shown in a sectional view only in FIGS. 11, 12, 16, and 17, whereas in FIGS. 13, 14, and 18, these elastic bands are omitted for the sake of clarity.

Figure 1:
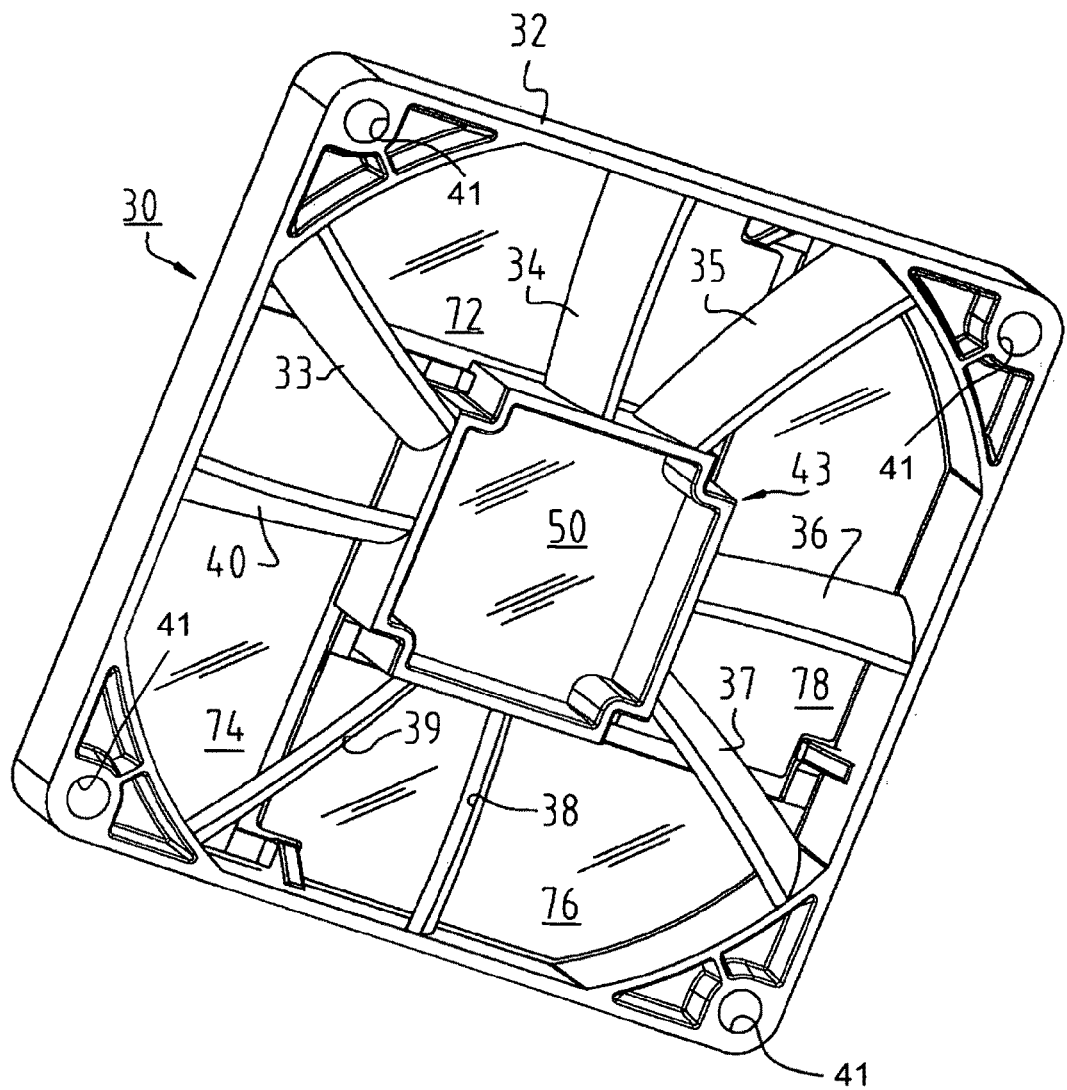
FIG. 1 is a perspective top view of an outflow baffle, viewed from its air inlet side, with the flaps closed.

FIG. 1 shows an outflow baffle 30 of the type that can be used in the invention. Naturally, such outflow baffles can be configured in an extremely wide variety of forms, i.e. the example shown does in fact represent the best embodiment currently available, but can be varied in a multitude of ways. Such an outflow baffle is often referred to as a set of outlet guide vanes.

An outflow baffle of this kind functions as follows:

Due to the rotation of the fan impeller, the air that comes out of an axial or diagonal fan flows in a helical motion, i.e. it moves approximately in corkscrew fashion. This helical motion does not have any useful function, but producing it requires energy. The outflow baffle transforms this helical motion into a static pressure that is useful in a fan, because it pushes the air through the electronic circuit or other device to be cooled.

The outflow baffle 30 has an outer frame 32 that is approximately square in the embodiment shown, but which could also be round, for example. In its four corners, this frame 32 has four mounting openings 41 of the usual kind known from device fans. The openings 41 are used for mounting purposes.

Figure 8:
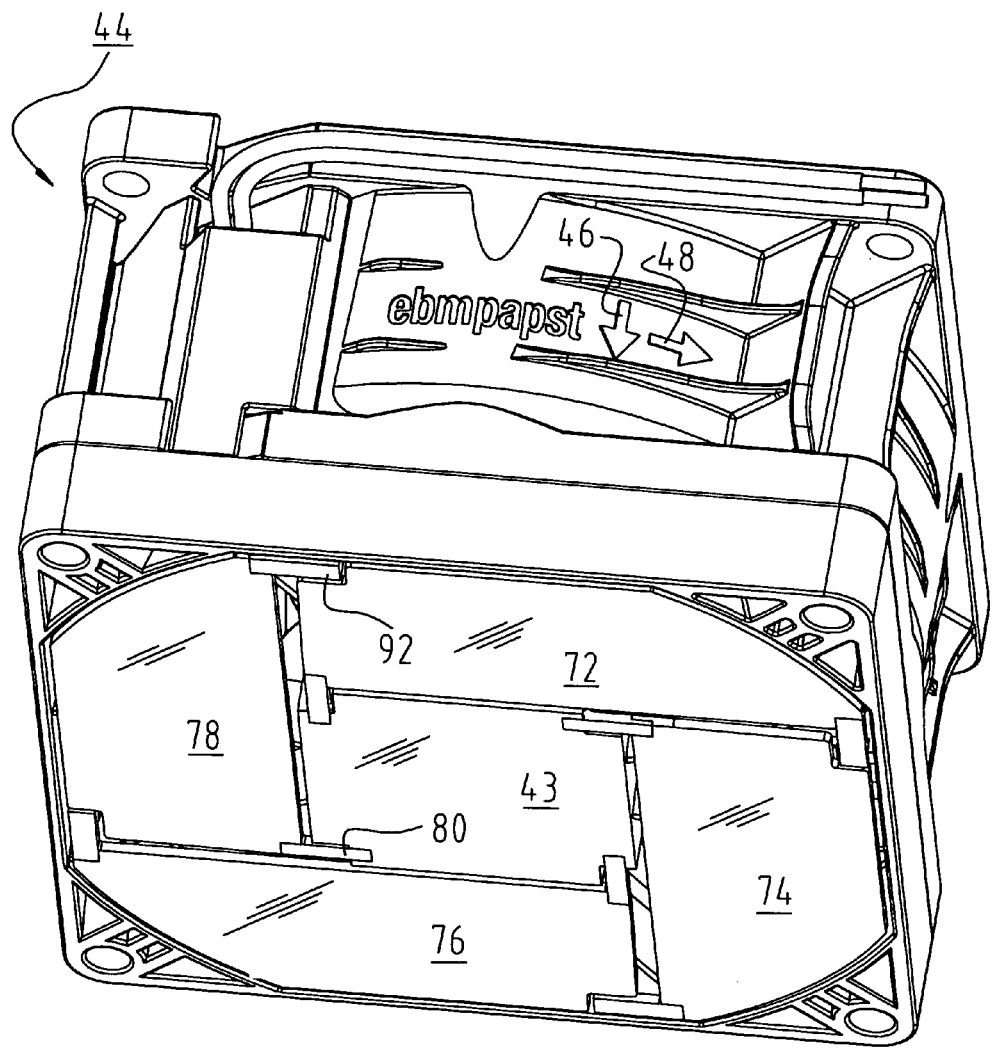
FIG. 8 shows a device fan (axial or diagonal fan) whose outlet side has an outflow baffle according to FIGS. 1 through 7 mounted on it, with closed flaps.
Figure 9:
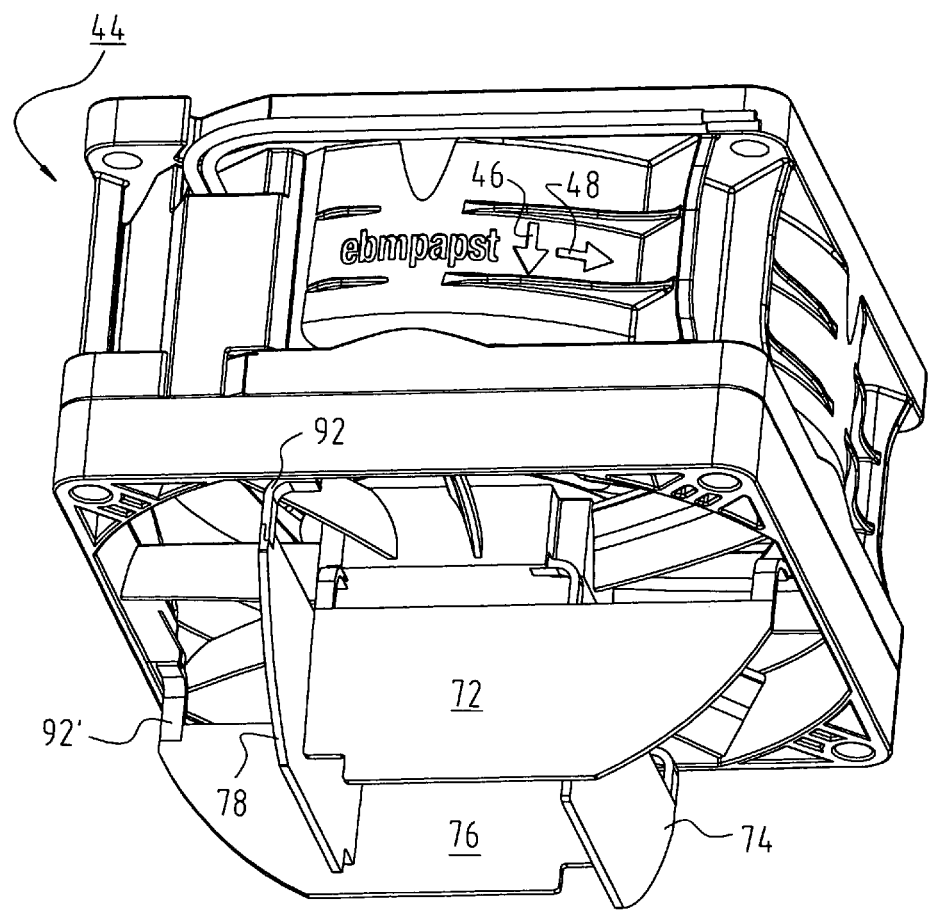
FIG. 9 is a view analogous to the one in FIG. 8, but with the flaps open.

A total of eight air-guiding elements 33 through 40, spaced apart from one another at similar angular intervals, extend radially inward from the frame 32 to an approximately rectangular inner holding element 43. The air-guiding elements 33 through 40 have approximately the same profile as the blades of the associated fan, i.e. usually an airfoil profile, and they are so shaped that they counteract the helical motion of the air flowing out of the associated fan 44 depicted by way of example in FIGS. 8 and 9.

In these two figures, the reference numeral 46 indicates the direction of the air flow and the reference numeral 48 indicates the rotation direction of the fan. This permits those skilled in the art to infer the type of helical motion of the air flowing out of the device fan 44.

The air-guiding elements 33 through 40 are preferably integrally joined to both the frame 32 and the inner holding element 43 so that the elements 33 through 40 support the holding element 43. It has a bottom 50 and is approximately the same size as the hub 52 (FIG. 15) of the fan impeller 54 of the associated fan 44. This hub 52 usually supports the drive motor (not shown) for the fan impeller 54.

Figure 15:
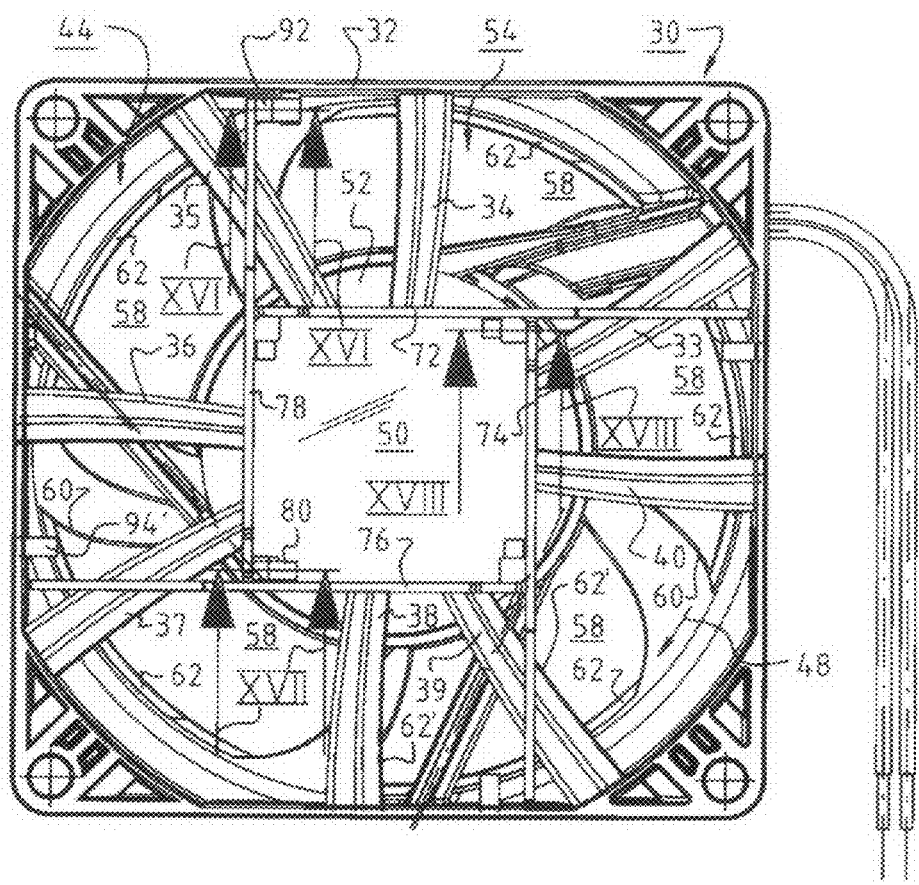
FIG. 15 is a top view analogous to FIG. 9, of the combination of a device fan and an outflow baffle, with the flaps open.

In FIG. 15, the five blades 58 of the fan impeller 54 are shown, by way of example. The drawing shows a fan 44 with five blades 58, the leading edges 60 of which are sickle-shaped. Preferably at their radially outer edges, the blades 58 have widened regions 62, which reduce the fan noise.

Figure 2:
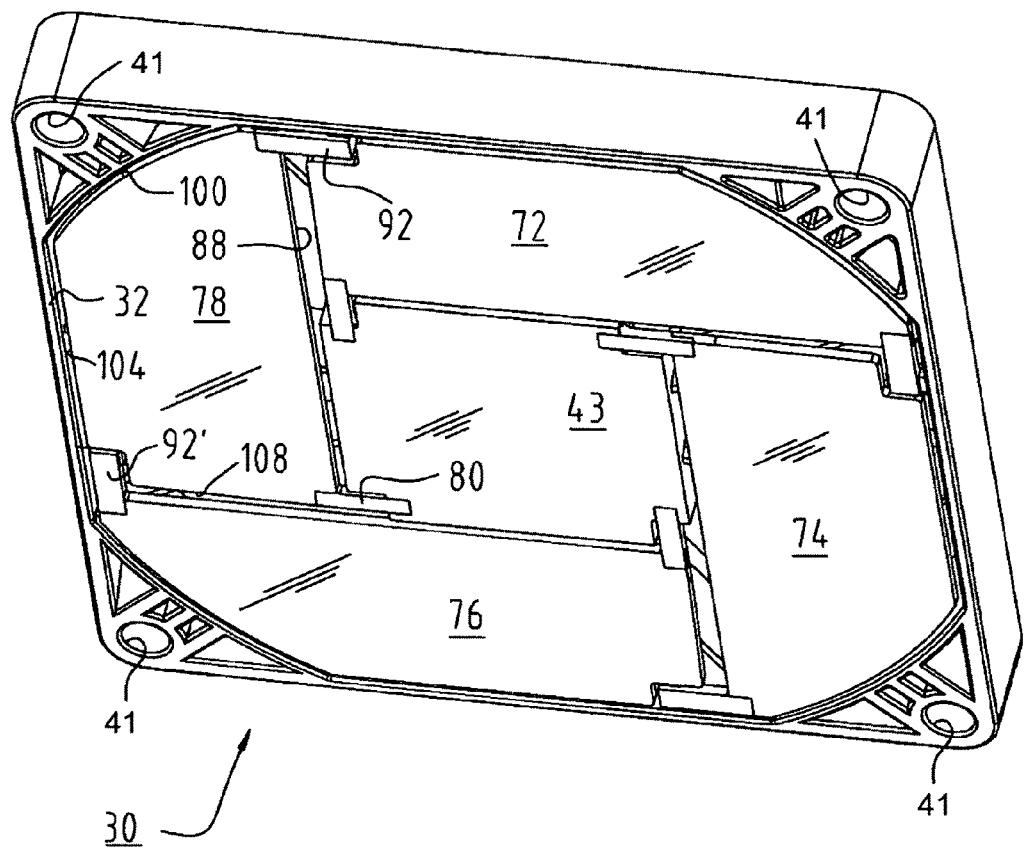
FIG. 2 shows the outflow baffle of FIG. 1, viewed from its air outlet side, likewise with the flaps closed.

The rotation direction 48 is also indicated in FIG. 15, i.e. the fan impeller 54 here rotates clockwise and in the direction toward the concave sides 62' of the radial holding elements 33 through 40. Between themselves, these radial holding elements define flow openings for the air supplied by the fan 44, for example the flow opening between the holding elements 37 and 38 in FIG. 1. When one fan in a battery of fans malfunctions, these flow openings must be closed by closing elements. To this end, according to FIG. 2, four non-return or check valve flaps 72, 74, 76, 78 are arrayed symmetrically around the inner holding element 43 and, in the exemplary embodiment, these four valve flaps are identically formed. To achieve a good damping action, they are preferably made of fiberglass-reinforced polypropylene. As FIG. 2 shows, in their closed position, the valve flaps 72, 74, 76, 78 are recessed into the surface of the outflow baffle 30 so that, during transport, they are protected by the protruding outer rim 32 of the outflow baffle 30.

Figure 3:
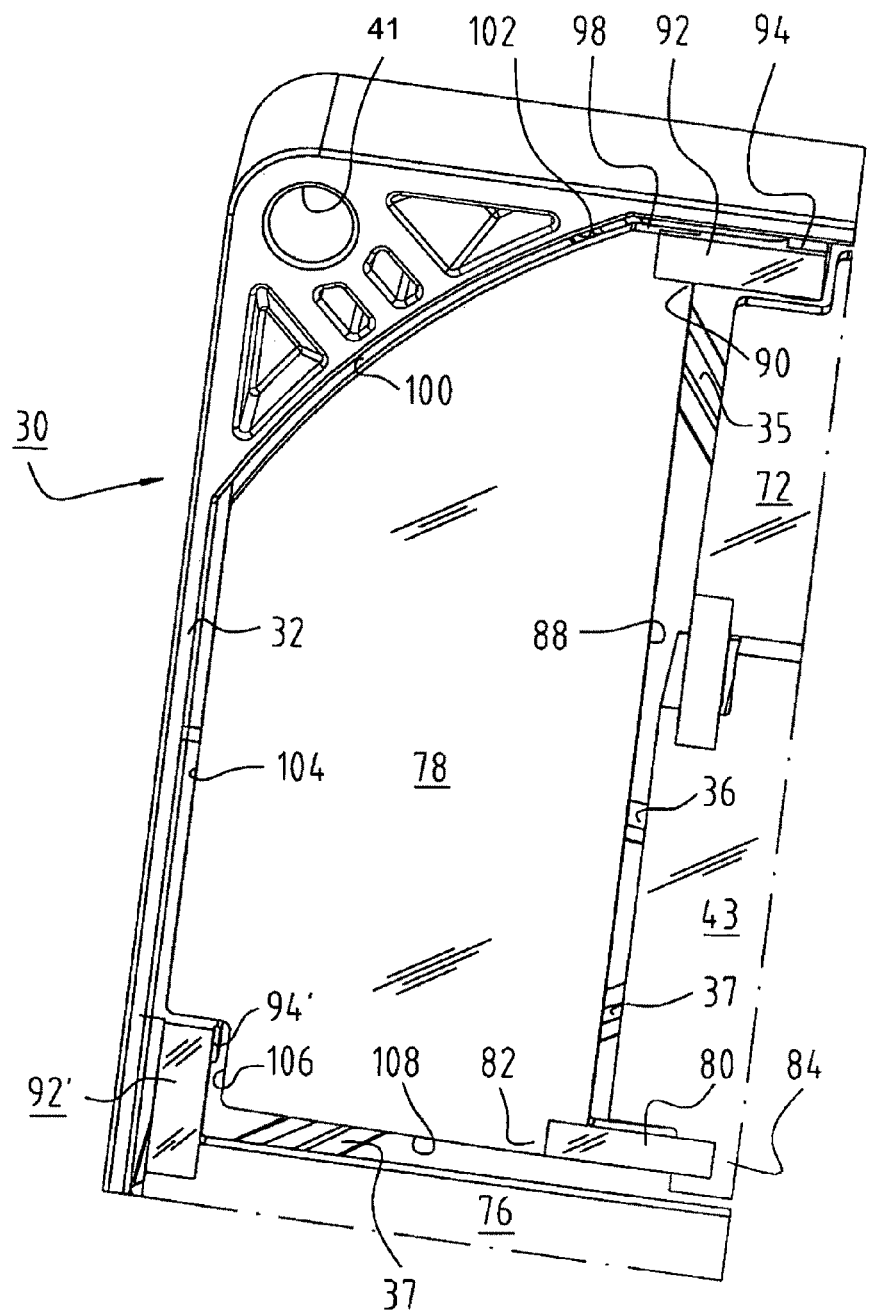
FIG. 3 is an enlarged view of one of the four check valve flaps.
Figure 4:
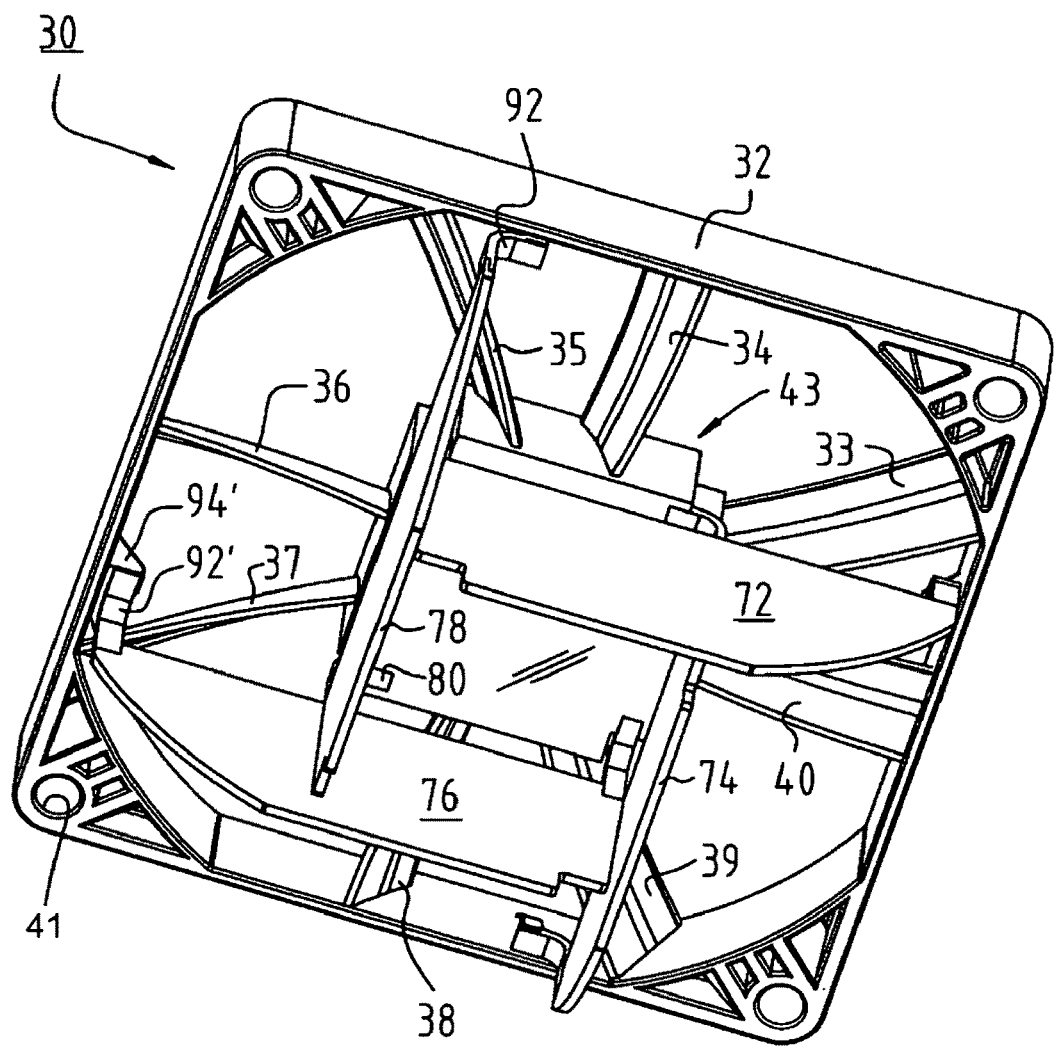
FIG. 4 is a depiction of the outflow baffle analogous to the one in FIG. 2, but with the flaps open.
Figure 5:
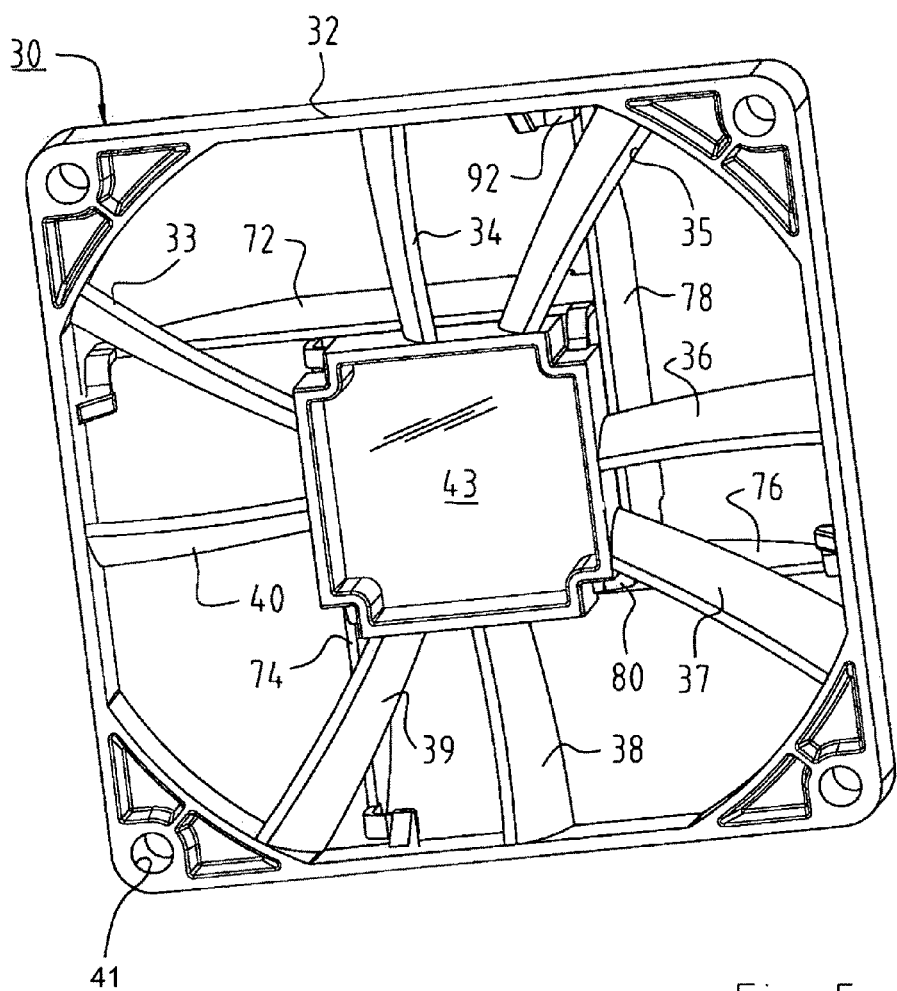
FIG. 5 shows the outflow baffle of FIG. 4, viewed form its air inlet side, with the flaps open.
Figure 6:
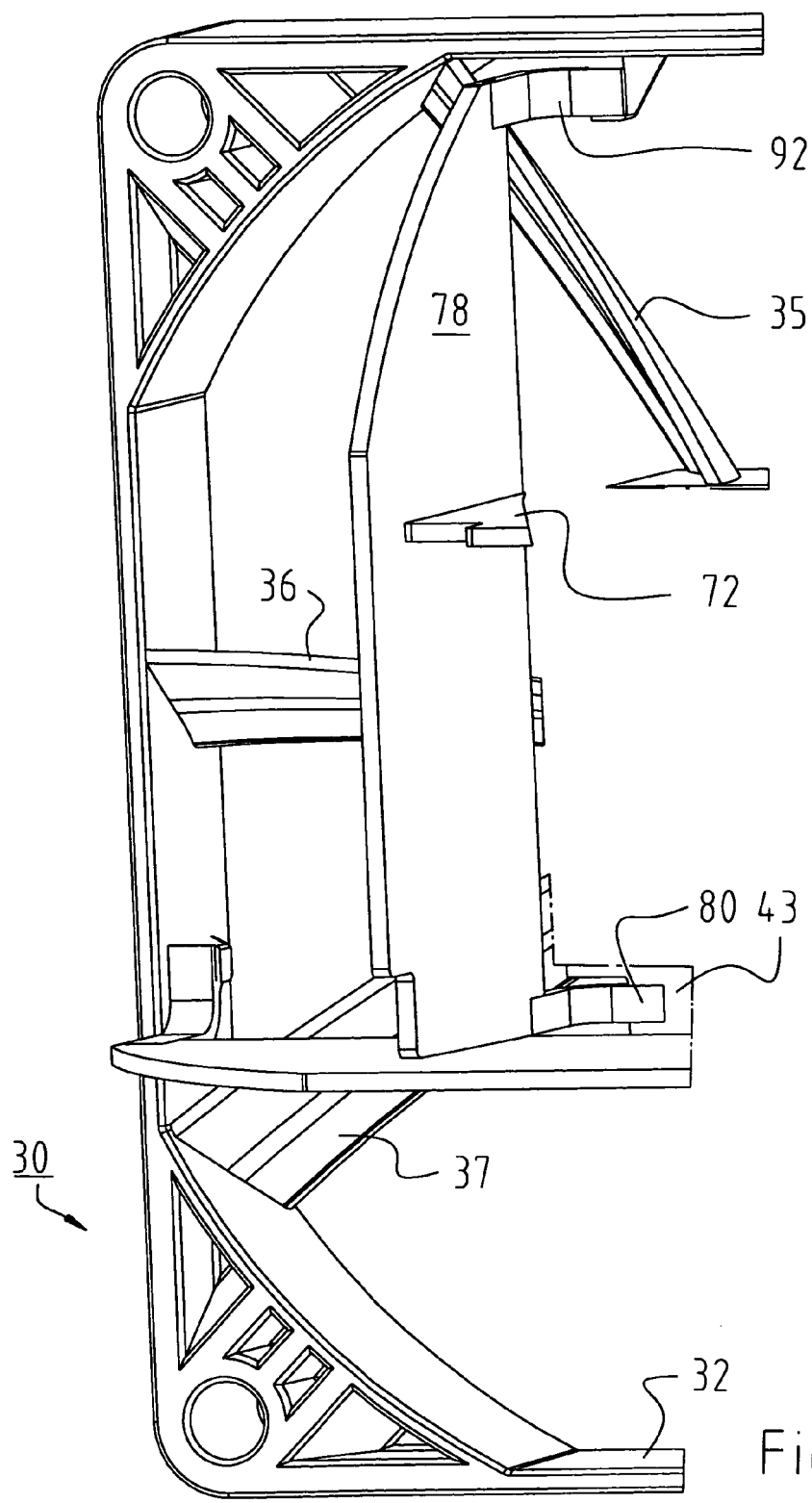
FIG. 6 is an enlarged view analogous to that of FIG. 4, but with the flaps open.
Figure 7:
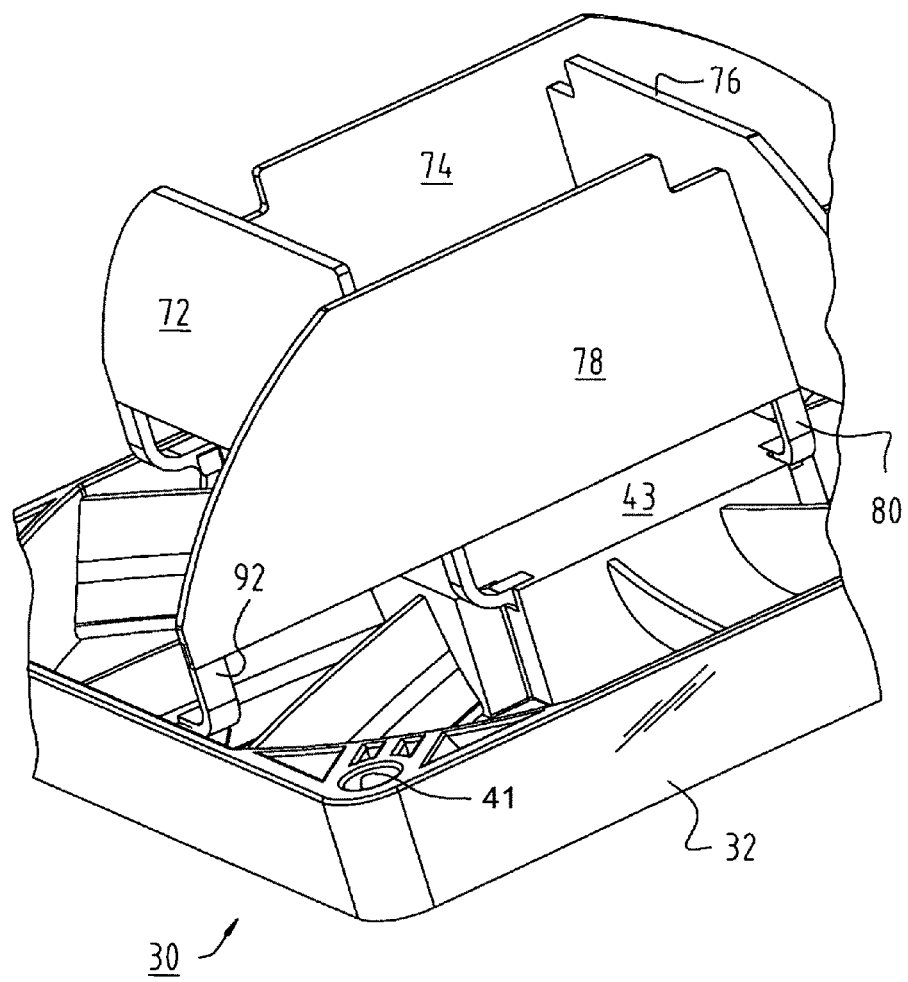
FIG. 7 is a perspective view analogous to the ones in FIGS. 4 through 6, with the four flaps in the open position.

FIG. 3 is a very enlarged depiction of the flap 78. By means of an elastic strip 80 at its radially inner corner 82, this flap is attached to the inner holding element 43 at the latter's bottom left corner 84 in FIG. 3. The elastic band 80 is comprised of an elastomeric plastic, preferably a thermoplastic elastomer (TPE), whose hardness is adjusted as needed. This strip 80 made of TPE is injection-molded onto the corner 82 of the valve flap 78 and onto the corner 84 of the inner holding element 43, i.e. it is attached to the valve flap 78 and the holding element 43 by being melted onto them. The injection procedure occurs while the valve flap 78 is in its closed position, as shown in FIG. 3. Therefore, when the valve flaps 72, 74, 76, 78 are open, as shown in FIG. 4, the TPE bands exert a restoring force on them, which attempts to pivot them into their respective closed positions, whenever air pressure slackens.

As shown in FIG. 3, flap 78 has a straight inner edge 88 whose upper end 90 in FIG. 3 likewise has a TPE band 92 injection-molded onto it; the right end of this band 92 in FIG. 3 is injection-molded onto a projection 94 that protrudes inward from the rim 32 and the left end of this band 92 in FIG. 3 is injection-molded onto the right, upper end 90 of the valve flap 78. As a result, the flap 78 in FIG. 3 can be pivoted from the left, for example by pressure of air driven from the fan, toward the right into an approximately perpendicular position, as shown in FIG. 4. Because of their identical form and identical attachments, the same applies to the other flaps 72, 74 and 76.

Adjoining the straight edge 88 and situated at a right angle to it, the flap 78 has a short, straight section 98 at the top, adjoined by a circular arc-shaped section 100, which is complementary to the opposing rim 102 of the outflow baffle 30. At its bottom end in FIG. 3, the section 100 transitions into a straight edge 104, which extends parallel to the edge 88, and the edge 104 extends down to a recess 106 at the bottom left corner of the valve flap 78. In FIG. 3, a straight lower edge 108 extends horizontally from this recess 106 to the corner 82. The valve flap 78 thus has approximately the outline of a rectangle whose upper left corner has been cut off.

As shown in the drawing, the recess 106 contains a projection or stop 94' of the frame 32; the drawing also shows that an elastic band 92' for the valve flap 76 is injection-molded onto this projection or stop 94'.

Figure 10:
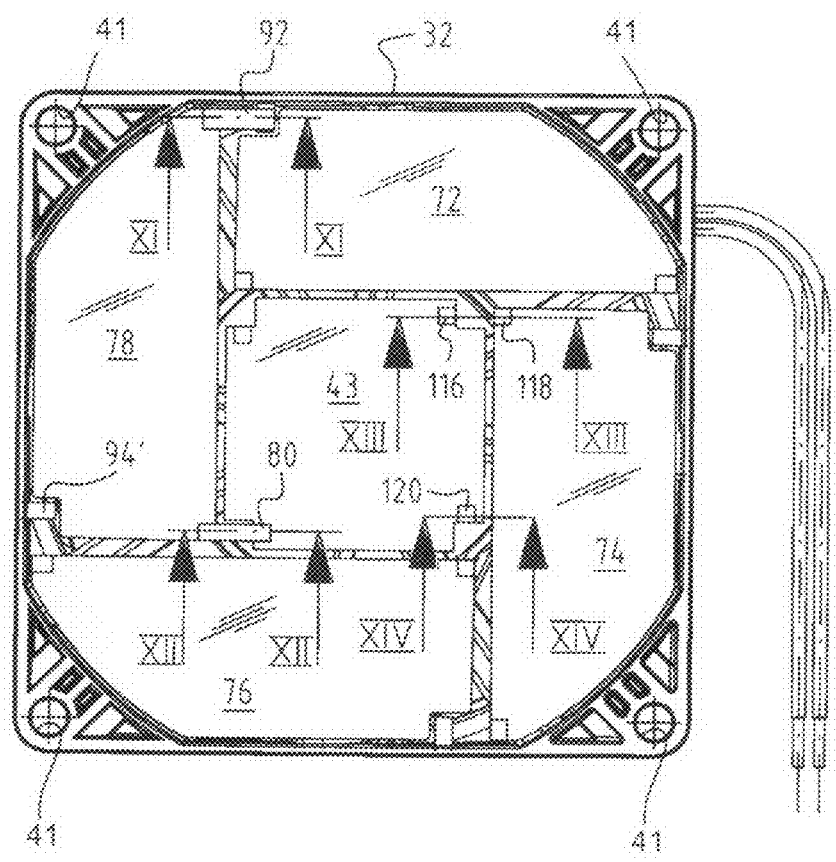
FIG. 10 is a top view analogous to FIG. 8, of the combination of a device fan and an outflow baffle, with the flaps closed.

FIG. 11 is a section, viewed along the line XI-XI of FIG. 10, through the elastic hinge band 92 made of TEP. At one end, this band is attached to a post 94 made of plastic, e.g. fiberglass-reinforced polypropylene, and is attached to this post by being melted onto it. At the other end, the hinge band is attached to the valve flap 78 (likewise comprised of polypropylene) that is provided with a cavity 110 for this purpose, which cavity is filled with the TPE of the band 92. As shown in the drawing, the band 92 also extends over the top of the post 94, in order to achieve a particularly durable attachment.

FIG. 12 is a section, viewed along the line XII-XII of FIG. 10. At the left is the valve flap 78, which has a cavity 112 to which the left end of the elastic hinge band 80 is attached by being melted into it. At the right, is the inner holding element 43, which is provided with a cavity 114 at the top, to which the right end of the hinge band 80 is attached, likewise by being melted into it.

FIG. 13 is a section, viewed along the line XIII-XIII of FIG. 10. The elastic hinge band is not shown here; only the corresponding cavity 116 at the top of the inner holding element 43 and a cavity 118 of the valve flap 74 are shown. Arranged as shown in FIG. 13, the parts are inserted into an injection mold (not shown) in which the hinge band is injection-molded out of TPE; this band has an appearance that is mirror-symmetrical to the band 80 shown in FIG. 12 and is therefore not shown here.

FIG. 14 is a section, viewed along the line XIV-XIV of FIG. 10. The elastic element is not shown here and only a cavity 120 of the inner holding member 43 is shown, in which this elastic element is anchored by means of an injection-molding process.

FIG. 15 is a depiction analogous to FIG. 10, but the flaps 72, 74, 76, 78 are shown in their open positions that they assume when the fan 44 is operating; the elastic hinge strips 80, 92 etc. are then bent by approx. 90° and exert a corresponding restoring force on the check valve flaps 72, 74, 76, 78. Only two of the total of eight hinge strips are shown.

FIG. 16 is a section, taken along line XVI-XVI of FIG. 15. This corresponds to the sectional view in FIG. 11, with the flap closed. The reference numerals are the same as in FIG. 11 and the reader is therefore referred to this earlier description.

FIG. 17 is a section, taken along line XVII-XVII of FIG. 15. This section corresponds to the one in FIG. 12, with the difference that in FIG. 12, the valve flap 78 is closed and in FIG. 17, it is open. The reference numerals are the same in both figures. FIG. 17 shows that, when open, the flap 72 adjacent to the valve flap 78 strikes with its bottom left corner 124 against the TPE material of the hinge band 80, which prevents clattering. Because of the symmetry of the arrangement, this applies equally to all of the valve flaps of the outflow baffle 30, which is why this outflow baffle can also be referred to as super-silent.

FIG. 18 is a section, taken along line XVIII-XVIII of FIG. 15, i.e. with the flap 74 open. The hinge band 126 is indicated in phantom with dot-and-dash lines.

It will be apparent that the present invention thus achieves a variety of advantageous effects. Since the outflow baffle 30 is combined to form a unit with the flaps 72, 74, 76, 78, this structural unit can be combined as needed with any fan 44 of the same size, as shown by way of example in FIGS. 8 and 9, thus only increasing the price of the fan 44 by an insignificant amount. Alternatively, the outflow baffle 30 can also be made part of the fan 44, if this is desirable due to the size of the production run.

The outflow baffle generates an additional static pressure, which compensates for at least part of the pressure less incurred by the flaps 72, 74, 76, 78.

The flaps can easily be injection-molded onto the outflow baffle 30 by means of the connecting elements mode of TPE. Alternatively, the flaps might be entirely comprised of TPE, in which case they would not require any special connecting elements.

A very reasonably priced design is achieved since the outflow baffle with its valve flaps can be ready-made in one injection-molding procedure. This avoids the need for the labor-intensive step of manually assembling individual parts, e.g. springs.

An outflow baffle of this type functions regardless of its position, which, in practice, is a significant advantage. Since the hardness of the TPE material can be adjusted, this means that the stiffness of the connecting elements can also be adjusted. It is therefore possible to change the outflow baffle depending on the intended air output, i.e. with a low air output, connecting elements are used that have only a low rigidity, whereas for higher air outputs, correspondingly stiffer connecting elements can be used.

An outflow baffle according to the invention, including its non-return flaps, requires only a small amount of space and generates only a small amount of noise, since it is possible to use plastic materials having a high level of internal damping.

An outflow baffle of this kind can particularly easily be adapted to axial fans and diagonal fans.

The outflow baffle upstream of the flaps acts on these flaps with an air flow having a reduced helical motion. As a result, the flaps have a lower tendency to vibrate/clatter, compared to prior art flap arrangements.

The injection-molded flap stops prevent the flaps from touching or getting caught on one another, and thus from jamming.

This also gives the customer the option of ordering the outflow baffles in the desired numbers and makes it very simple to keep a few spare outflow baffles on hand and to replace any malfunctioning or broken outflow baffles, as needed, with these spare parts, without having to replace the entire fan.

Naturally, numerous variations and modifications are possible, within the scope of the present invention.

What is claimed is:

1. A fan (44) in the form of an axial or diagonal fan, comprising:
   a fan housing formed with an air inlet opening and an air outlet opening, and having
   an outflow baffle (30) provided adjacent the air outlet opening, which baffle (30) includes a plurality of stationary air-guiding vanes (33-40) shaped to counteract helical motion of air flowing out of the fan (44) and to at least partially convert said helical motion, of the air flowing out of the fan (44), into static pressure, said air-guiding vanes (33-40) defining at least one air passage opening,
   wherein said baffle (30), on an outlet side of this air passage opening, is provided with
   at least one non-return flap (72, 74, 76, 78), pivotable between a fully open orientation, aligned with an axis of said fan, and a closed orientation, substantially co-planar with said air outlet opening, in which said flap at least partially closes the air passage opening, and
   wherein at least one elastic element (80,92) couples together said baffle (30) and said flap, and acts on this non-return flap in a direction toward said closed orientation thereof.

2. The fan of claim 1, wherein the outflow baffle (30) has a centrally located holding element (43) that is surrounded by air passage openings for a flow of air coming out of the fan (44).

3. The fan of claim 2, wherein the outflow baffle (30) has corner regions and, in a closed baffle configuration, at least one non-return flap (72, 74, 76, 78) extends from the holding element (43) to a corner region of the outflow baffle (30).

4. The fan of claim 2, wherein at least one outer flap is hingedly connected to a radially outer region of the outflow baffle (30) and cooperates with an inner flap hingedly connected to the holding element (43), in order, in a closed state of the two flaps, to close an air passage opening of the outflow baffle (30) associated with them.

5. The fan of claim 4, in which in addition to being hingedly connected to the holding element (43), a non-return flap (72, 74, 76, 78) is also hingedly connected to an edge region (32) of the outflow baffle (30).

6. The fan of claim 5, in which a hinge point (92) is provided for hinge connection, in the edge region (32), of the outflow baffle (30), which hinge point (92) is associated with a predetermined flap (72, 74, 76, 78) and is situated in a region, which, when the flaps (72, 74, 76, 78) are closed, protrudes through a recess of a non-return flap adjacent to the predetermined non-return flap.

7. The fan of claim 5, wherein the plurality of stationary air-guiding vanes (33-40) extend between a central holding element (43) and a frame (32) of the outflow baffle (30) surrounding it and function as supporting elements for the central holding element (43).

8. The fan of claim 5, wherein the housing of the outflow baffle (30) is formed as a single piece with the housing of the device fan (44).

9. The fan of claim 1, in which the elastomer (80, 92) is attached by means of plastic injection-molding to at least one element of a set comprised of the non-return flap (72, 74, 76, 78) and the outflow baffle (30).

10. The fan of claim 1, in which the elastomer has the form of a flexible band (80, 92).

11. A plug-in fan unit containing a plurality of fans according to claim 1.

12. The fan of claim 1, wherein each of said air-guiding vanes has a cross-sectional profile resembling an airfoil.

13. A method of making a noise-damping outflow baffle for a fan, comprising the steps of
   arranging a plurality of generally planar flaps (72,74,76, 78) in a closed orientation against a frame (32) and a holding element (43) aligned within the frame;
   injection-molding thermoplastic elastomer (TPE) bands between said holding element (43) and at least one edge (88) of each respective flap, and permitting said thermoplastic elastomer to cool, thereby forming an elastomeric hinge connection (92, 92') between each flap and said holding element (43), said elastomeric hinge connection providing a restoring force, tending to swing said flap back into said closed orientation, whenever air pressure against said flap slackens.

14. A fan (44) in the form of an axial or diagonal fan, comprising
a fan housing formed with an air inlet opening and an air outlet opening and having
an outflow baffle (30), provided adjacent the air outlet opening, which includes a plurality of air-guiding vanes which define an air passage opening, said baffle being provided with at least one non-return flap (72, 74, 76, 78) which, in a closed orientation, at least partially closes the air passage opening;
wherein the outflow baffle has a centrally located holding element (43) that is surrounded by air passage openings for a flow of air coming out of the fan;
at least one outer flap is hingedly connected to a radially outer region of the outflow baffle (30) and cooperates with an inner flap hingedly connected to the holding element (43) in order to close an air passage opening of the outflow baffle associated with them; and
wherein, in addition to being hingedly connected to the holding element (43), a non-return flap is also hingedly connected to an edge region (32) of the outflow baffle; and
wherein a hinge point (92) is provided in the edge region of the outflow baffle, which hinge point is associated with a predetermined non-return flap and is situated in a region which, when the flaps are closed, protrudes through a recess of a non-return flap adjacent to the predetermined non-return flap.

* * * * *